（12）United States Patent
Kumar et al.

(10) Patent No.: US 9,466,730 B2
(45) Date of Patent: Oct. 11, 2016

(54) SEMICONDUCTOR DEVICE AND METHOD FOR FABRICATING THE SAME

(71) Applicant: Vanguard International Semiconductor Corporation, Hsinchu (TW)

(72) Inventors: Rahul Kumar, Jamshedpur (IN); Manoj Kumar, Dhanbad (IN); Gene Sheu, Taichung (TW); Shao-Ming Yang, Taichung (TW); Rudy Octavius Sihombing, Medan (ID); Chia-Hao Lee, New Taipei (TW); Shang-Hui Tu, Jhubei (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 14/158,251

(22) Filed: Jan. 17, 2014

(65) Prior Publication Data

US 2015/0206966 A1    Jul. 23, 2015

(51) Int. Cl.
  *H01L 29/788*  (2006.01)
  *H01L 21/28*  (2006.01)
  *H01L 29/66*  (2006.01)
  (Continued)

(52) U.S. Cl.
  CPC ....... *H01L 29/788* (2013.01); *H01L 21/02252* (2013.01); *H01L 21/265* (2013.01); *H01L 21/26586* (2013.01); *H01L 21/28273* (2013.01); *H01L 21/76224* (2013.01); *H01L 29/0623* (2013.01); *H01L 29/0634* (2013.01);
  (Continued)

(58) Field of Classification Search
  CPC ............. H01L 26/407; H01L 29/0634; H01L 29/1095; H01L 29/872; H01L 21/26586; H01L 29/0653; H01L 29/7811; H01L 29/402; H01L 29/0619; H01L 29/0661; H01L 29/66727; H01L 29/0649; H01L 29/0623; H01L 29/404
  See application file for complete search history.

(56) References Cited

U.S. PATENT DOCUMENTS 5,972,733 A * 10/1999 Hynecek ........... H01L 27/14887
                                                    257/E27.162
2004/0056310 A1* 3/2004 Probst ................. H01L 29/0661
                                                    257/367

(Continued)

FOREIGN PATENT DOCUMENTS

JP    2013-120931 A    6/2013
TW    200807698 A    2/2008

(Continued)

*Primary Examiner* — Dale E Page
*Assistant Examiner* — John Bodnar
(74) *Attorney, Agent, or Firm* — Birch, Stewart, Kolasch & Birch, LLP (57) ABSTRACT

The invention provides a semiconductor device, including: a substrate of a first conductivity type having an active region and a termination region; an epitaxial layer of the first conductivity type over the substrate; a plurality of first trenches and second trenches formed in the epitaxial layer; an implant blocker layer formed at bottoms of the first and second trenches; a liner of a second conductivity type different from the first conductivity type conformally formed along sidewalls of the first and second trenches; a dielectric material filled in the first and second trenches defining a plurality of first columns and a plurality second column, respectively; a gate dielectric layer over the epitaxial layer; two floating gates formed on the gate dielectric layer; a source region; an inter-layer dielectric layer; and a contact plug formed on the source region.

13 Claims, 9 Drawing Sheets

(51) Int. Cl.
  *H01L 29/423* (2006.01)
  *H01L 21/265* (2006.01)
  *H01L 21/762* (2006.01)
  *H01L 21/02* (2006.01)
  *H01L 29/06* (2006.01)
  *H01L 29/40* (2006.01)

(52) U.S. Cl.
  CPC ....... *H01L29/407* (2013.01); *H01L 29/42324* (2013.01); *H01L 29/66825* (2013.01)

(56) References Cited

U.S. PATENT DOCUMENTS

| | | | |
|---|---|---|---|
| 2004/0173844 A1* | 9/2004 | Williams | H01L 29/4236 257/329 |
| 2006/0134867 A1 | 6/2006 | Blanchard | |
| 2007/0023827 A1* | 2/2007 | Tu | H01L 29/0634 257/330 |
| 2007/0029577 A1* | 2/2007 | Kinoshita | H01L 21/28097 257/213 |
| 2008/0179671 A1* | 7/2008 | Saito | H01L 29/0634 257/341 |
| 2008/0185643 A1* | 8/2008 | Hossain | H01L 29/0634 257/342 |
| 2012/0273884 A1* | 11/2012 | Yedinak | H01L 29/0878 257/341 |
| 2013/0200451 A1* | 8/2013 | Yilmaz | H01L 29/66727 257/331 |

FOREIGN PATENT DOCUMENTS

| | | |
|---|---|---|
| TW | 201222791 A1 | 6/2012 |
| TW | 201347180 A | 11/2013 |

\* cited by examiner

SEMICONDUCTOR DEVICE AND METHOD FOR FABRICATING THE SAME

BACKGROUND OF THE INVENTION

1. Field of the Invention

The present invention relates to a semiconductor device, and in particular, relates to a super junction semiconductor device 2. Description of the Related Art There is a large demand for energy saving electronic devices since eco-friendly products and green technology have been advocated in recent years. To meet the growing need for such devices, semiconductor industries are moving towards a more energy-conscious perspective. Super junction metal-oxide-semiconductor field effect transistors (MOSFETs) that provide improved energy efficiency has accordingly been developed. Compared to the conventional planar MOSFET structures, super junction MOSFETs are capable of reducing the on-resistance to a very low degree without affecting the voltage tolerance of the devices. As the result, a MOSFET with a lower on-resistance per unit area can be produced.

A typical super junction MOSFET device includes two regions, an active region (also referred to as cell region) and a termination region. The termination region of a super junction MOSFET device is designed to sustain the transverse electric potential voltage in the device. When the potential voltage sustained by the termination region is small, there is a large electric field generated in vertical and horizontal directions in the device. Accordingly, the termination region of the device easily breaks down.

Therefore, an improved super junction device is needed.

BRIEF SUMMARY OF THE INVENTION

An exemplary embodiment provides a semiconductor device, including: a substrate of a first conductivity type having an active region and a termination region an epitaxial layer of the first conductivity type over the substrate; a plurality of first trenches in the epitaxial layer of the active region; a plurality of second trenches in the epitaxial layer of the termination region; an implant blocker layer formed at bottoms of the first and second trenches; a liner of a second conductivity type different from the first conductivity type conformally formed along sidewalls of the first and second trenches; a dielectric material filled in the first and second trenches defining a plurality of first columns and a plurality second column, respectively; a gate dielectric layer over the epitaxial layer; two floating gates formed on the gate dielectric layer over opposite sides of a first column which is farthest away from the termination region; a source region formed between the floating gates; an inter-layer dielectric layer covering the gate dielectric layer and the floating gates; and a contact plug formed on the source region through the inter-layer dielectric layer.

Another exemplary embodiment provides a method for fabricating a semiconductor device, comprising; providing a substrate of a first conductivity type, wherein the substrate has an active region and a termination region; forming an epitaxial layer of the first conductivity type over the substrate; forming a plurality of first trenches in the epitaxial layer of the active region; forming a plurality of second trenches in the epitaxial layer of the termination region; forming an implant blocker layer at bottoms of the first and second trenches; forming a liner conformally on sidewalls of the first and second trenches; implanting a dopant of a second conductivity type into the liner, wherein the first and second conductivity types are different, and wherein the implant blocker layer blocks the dopant from entering into the bottoms of the first and second trenches; filling a dielectric material into the first and second trenches to form a plurality of first columns and a plurality second column, respectively; forming a gate dielectric layer over the epitaxial layer; forming two floating gates on the gate dielectric layer over opposite sides of a first column which is farthest away from the termination region; forming a source region between the floating gates; forming an inter-layer dielectric layer covering the gate dielectric layer and the floating gates; and forming a contact plug on the source through the inter-layer dielectric.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The present invention will be described with respect to particular embodiments and with reference to certain drawings, but the invention is not limited thereto and is only limited by the claims The drawings described are only schematic and are non-limiting. In the drawings, the size of some of the elements may be exaggerated and not drawn to scale for illustrative purposes. The dimensions and the relative dimensions do not correspond to actual dimensions to practice the invention.

FIGS. 1-13 are cross-sectional views illustrating the flow-chart of a method for forming a super junction semiconductor device in accordance with embodiments of the present disclosure.

Figure 1:
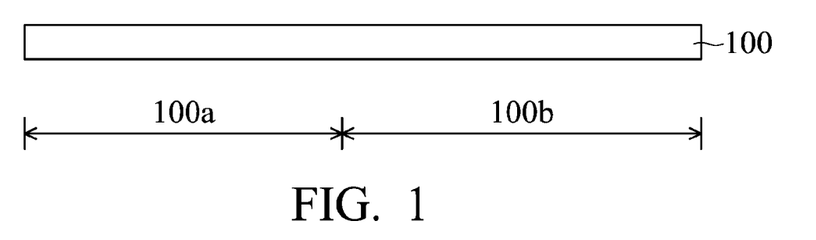
FIGS. 1-13 are cross-sectional views illustrating the flow-chart of a method for forming a super junction semiconductor device in accordance with embodiments of the present disclosure.

Referring to FIG. 1, a substrate 100 of a first conductivity is provided. The substrate 100 has an active region 100a and a termination region 100b adjacent to the active region 100a. The substrate 100 may be a bulk silicon substrate, silicon-on-insulator (SOI) substrate, or the like. In addition, other suitable substrates may also be used, such as a multi-layered substrate, gradient substrate, hybrid orientation substrate, or the like. In some embodiments, the substrate 100 may have a first conductivity type of p-type, such as a boron doped substrate. In other embodiments, the substrate 100 may have a first conductivity type of n-type, such as a phosphor or arsenic substrate. Any other suitable substrates may also be used. In one embodiment, the substrate 100 is a heavily doped n-type (N+) substrate.

Figure 2:
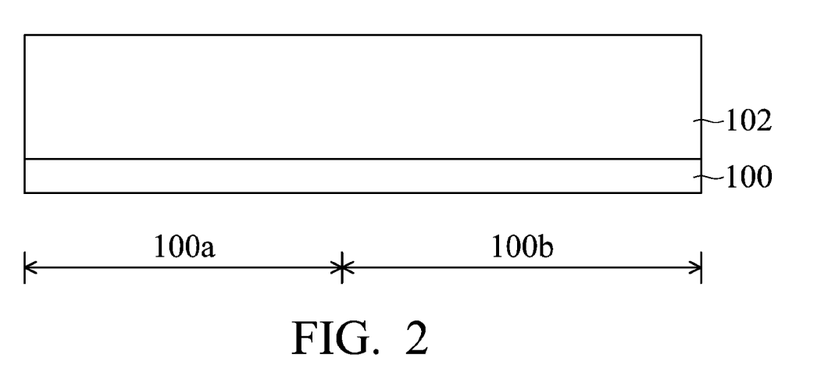

Referring to FIG. 2, an epitaxial layer 102 of the first conductivity type is formed on the substrate 100. The substrate 100 has a doping concentration larger than that of the epitaxial layer 102. For example, when the first conductivity type is n-type, the substrate 100 may be a heavily doped n-type (N+) substrate 100, while the epitaxial layer 102 may be a lightly doped n-type (N−) epitaxial layer. The epitaxial layer 102 may be formed by epitaxial growth to a thickness ranging from 1 to 100 μm depend on the device range.

Figure 3:
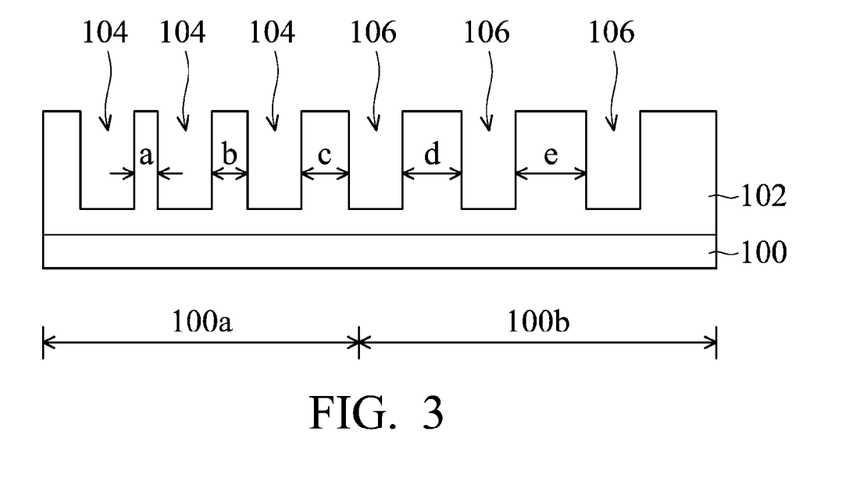

After the epitaxial layer 102 is formed, a process for forming a plurality of trenches in the epitaxial layer 102 is performed. Referring to FIG. 3, a plurality of first trenches 104 are formed in the epitaxial layer 102 of the active region 100a, and a plurality of second trenches 106 are formed in the epitaxial layer 102 of the termination region 100b. The first and the second trenches 104 and 106 may be formed by lithography and etching processes. In some embodiments, the distance between the first and the second trenches 104 and 106 may vary from active region 100a to termination region 100b. For example, the distance between the first and the second trenches 104 and 106 may increase from active region 100a to termination region 100b. In particular, the distance a is smaller than the distance b, the distance b is smaller than the distance c, the distance c is smaller than the distance d, and the distance d is smaller than the distance e. However, in other embodiments, the distance between the first and the second trenches 104 and 106 are the same.

Figure 4A:
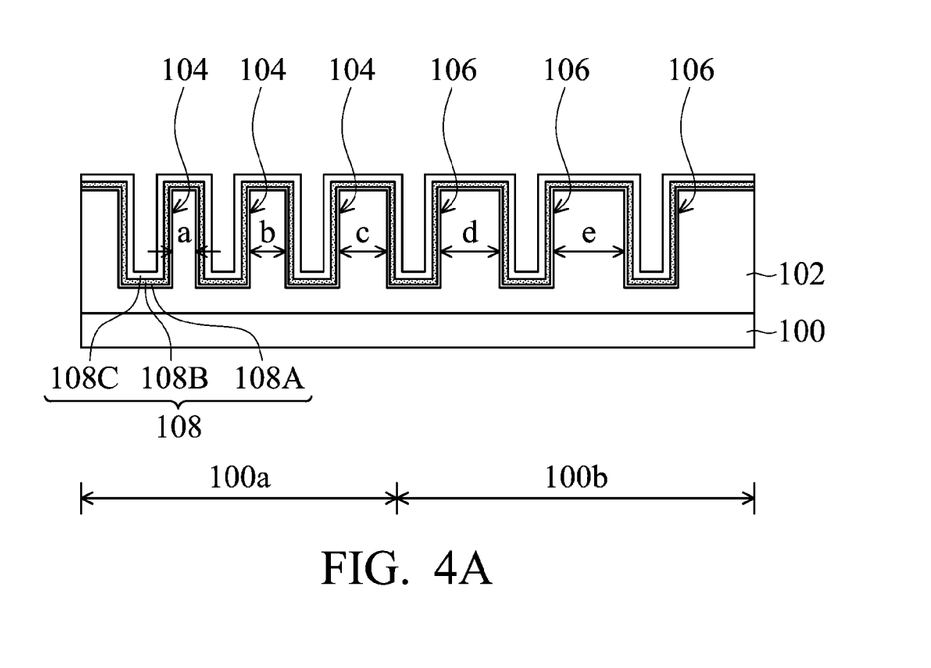
Figure 4B:
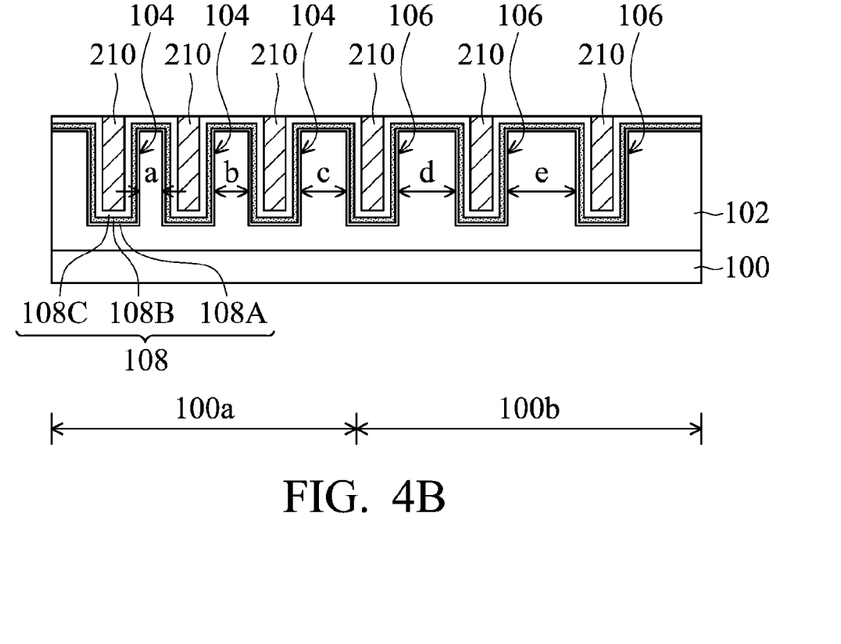
Figure 4C:
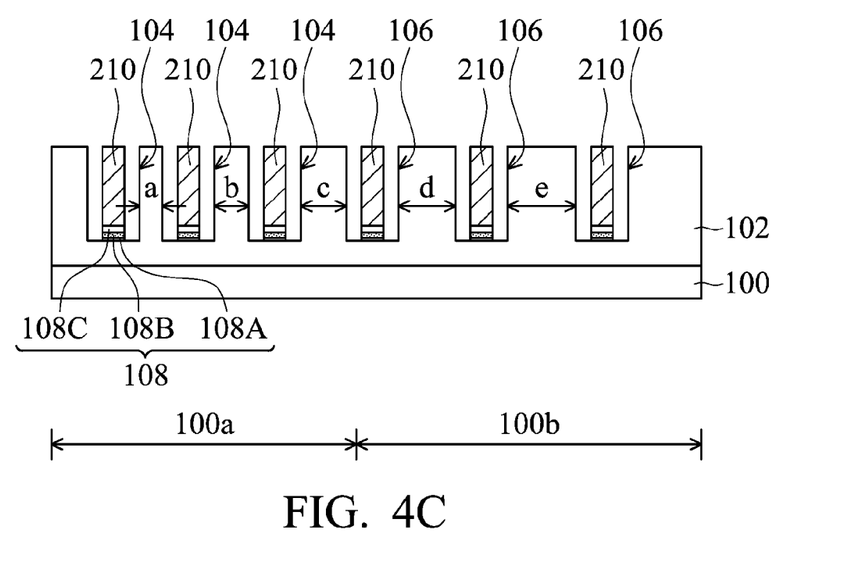
Figure 4D:
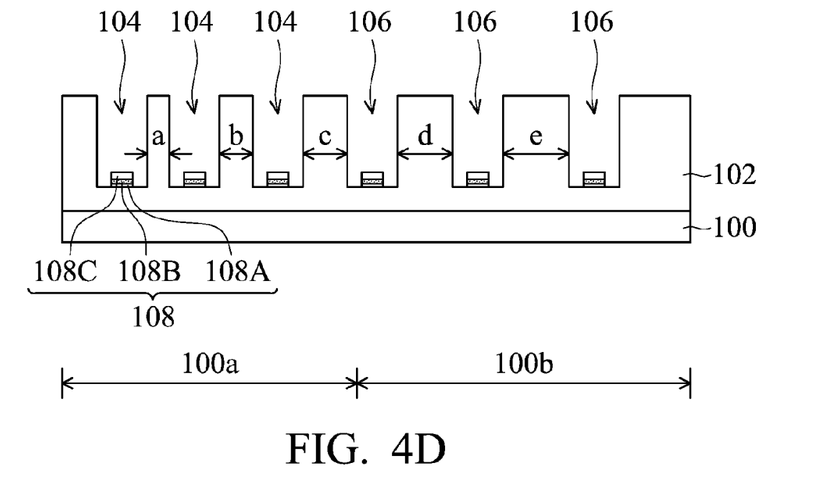

After the formation of the first and the second trenches, an implant blocker is formed in the first and the second trenches 104 and 106. FIGS. 4A-4D illustrates the steps for forming an implant blocker layer 108 in accordance to an embodiment. Referring to FIG. 4A, a first oxide layer 108A, a nitride layer 108B, and a second oxide layer 108C are sequentially formed conformally over the epitaxial layer 102. The thickness ratio between the first oxide layer 108A, the nitride layer 108B, and the second oxide layer 108C is about 1-10:1-10:1-50. The first and second oxide layer 108A and 108C may include silicon oxide, tetraethyl orthosilicate (TEOS) oxide, or combinations thereof, and the nitride layer 108B may include silicon nitride, or silicon oxynitride or combinations thereof. In one embodiment, the first oxide layer 108A is a silicon oxide layer, the nitride layer 108B a silicon nitride layer, and the second oxide layer is a TEOS oxide layer. The layers 108A, 108B, and 108C may be formed by a deposition process, such as chemical vapor deposition (CVD) or be thermally grown by oxidation or nitridation processes. After the layers 108A, 108B, and 108C are formed, a mask layer 210 is formed to completely fill the first and the second trenches 104 and 106 that expose the surface of the second oxide layer 108C, as shown in FIG. 4B. Referring to FIG. 4C, portions of the first oxide layer 108A, the nitride layer 108B, and the second oxide layer 108C that are not covered by the mask layer 210 are removed. The removal method may be a wet etching process. After the step in FIG. 4C, the mask layer 210 is removed, the remaining portions of the first oxide layer 108A, the nitride layer 108B, and the second oxide layer 108C form the implant blocker layer 108, as shown in FIG. 4D. In this embodiment, the implant blocker layer 108 does not directly contact the sidewalls of the trenches 104 and 106. The bottom sidewalls of the trenches 104 and 106 are exposed. The overall thickness of the implant blocker layer 108 varies in between 1000 A to 5000 A. In one embodiment, the overall thickness of the implant blocker layer 108 is about 2000 A.

FIG. 4D' illustrates a cross-sectional view of the implant blocker layer 108 in accordance to another embodiment. In the embodiment of FIG. 4D', a first oxide layer 108A', a nitride layer 108B', and a second oxide layer 108C' are formed directly at the bottom of the first and second trenches 104 and 106 by, for example, a high density plasma chemical vapor deposition (HDPCVD) process. In the embodiment, the removal process as shown in FIGS. 4A-4C is not required since the layers 108A', 108B' and 108C' are directly formed only in the trenches 104 and 106, and an implant blocker layer 108', which is formed by the layers 108A', 108B' and 108C', covers the sidewalls at the bottoms of the first and second trenches 104 and 106. The thickness ratio between the first oxide layer 108A', the nitride layer 108B', and the second oxide layer 108C' is about 1-10:1-10:1-50. The overall thickness of the implant blocker layer 108' varies in between 1000 A to 5000 A. In one embodiment, the overall thickness of the implant blocker layer 108' is about 2000 A.

Although the implant blocker layer 108 illustrated in FIG. 4D and FIG. 4D' is an oxide-nitride-oxide composite layer, it should be noted that the implant blocker layer may include other configurations, such as a nitride-oxide-nitride composite layer, a nitride-oxide composite layer, or an oxide-oxynitride-oxide composite layer. In the following, the implant blocker layer 108' shown in FIG. 4D' will be used as an illustrative example for further description.

Figure 5:
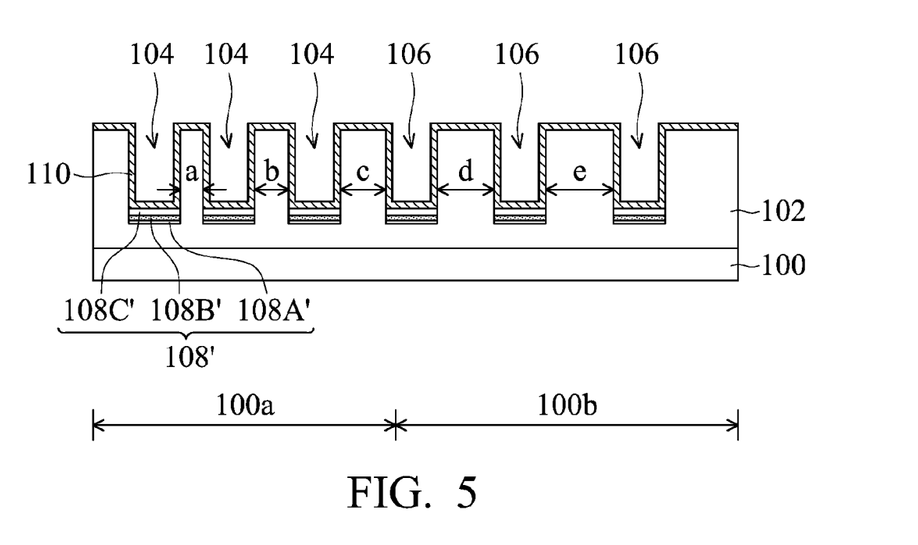

After the formation of the implant blocker layer 108', a liner 110 is formed conformally over the epitaxial layer 102, as shown in FIG. 5. The liner 110 may include a dielectric material, such as silicon oxide, silicon nitride, silicon oxynitride or other suitable materials. It should be noted that although the steps illustrated in FIG. 5 is performed on the implant blocker layer 108' shown in FIG. 4D', however, the steps in FIG. 5 may also be performed on the implant blocker layer 108 shown in FIG. 4D. In the embodiments of forming the liner 110 on the implant blocker layer 108 as shown in FIG. 4D, the liner 110 is also formed on the sidewalls and the bottoms of the trenches 104 and 106 that are not covered by the implant blocker layer 108. The liner 110 may have a thickness of about 100-500 A.

Figure 6:
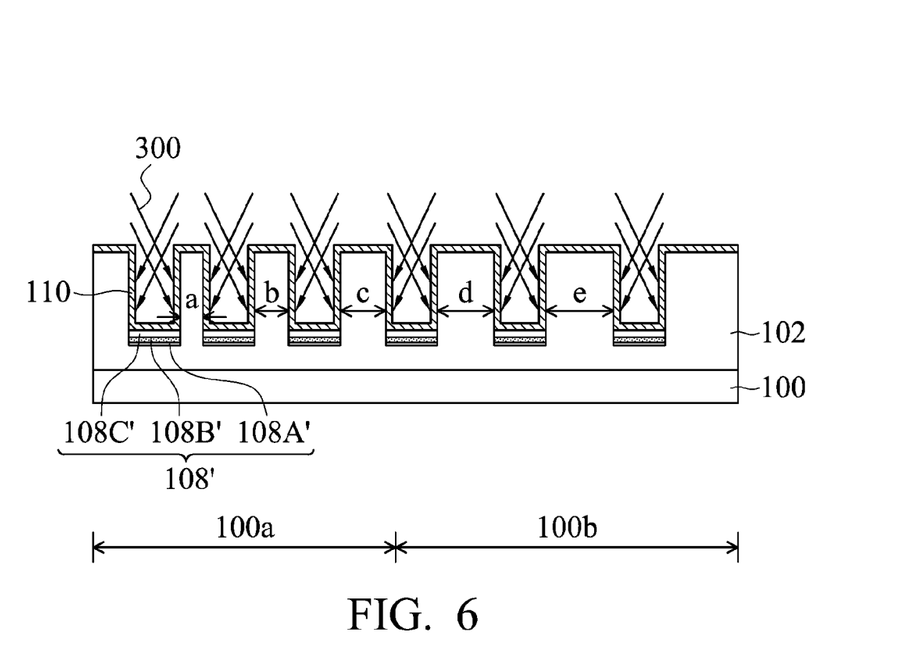

Referring to FIG. 6, following the steps of FIG. 5, an implant process 300 is performed to implant a dopant of a second conductivity type at an angle into the liner 110 on the sidewalls of the trenches 104 and 106. The first and the second conductivity types are different. For example, when the first conductivity is n-type, the second conductivity type is p-type. In the step of performing the implant process 300, the implant blocker layer 108' blocks the dopant from entering into the bottoms of the first and second trenches 104 and 106.

Figure 7:
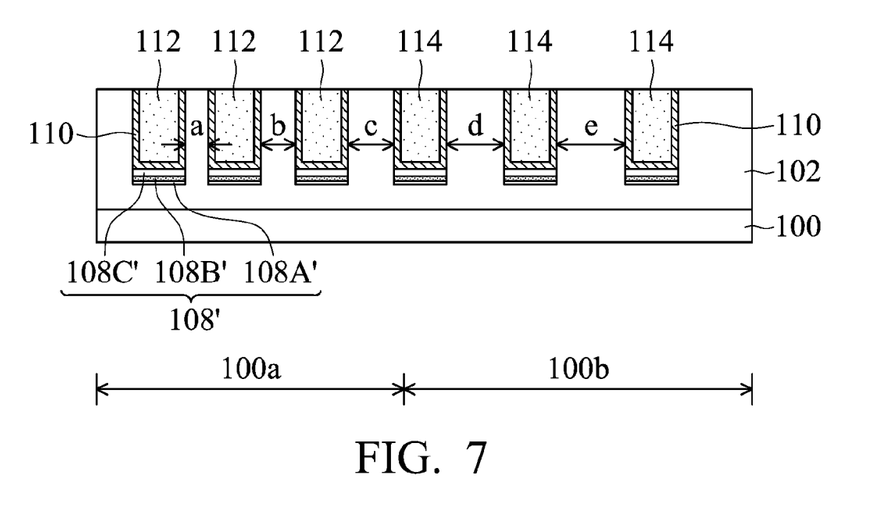

Referring to FIG. 7, after the liner 110 is implanted with the dopant of the second conductivity type, a dielectric material is filled into the first and second trenches 104 and 106, thereby forming a plurality of first columns 112 and a plurality of second columns 114, respectively. The dielectric material may be silicon oxide, silicon nitride, silicon oxynitride, low-k dielectrics, other suitable dielectric materials, or combinations thereof. The method for filling the dielectric material may include a deposition process and a CMP process. The deposition process may include CVD. The CMP process may also removes the portion of the liner 110 beyond the epitaxial layer 102.

Figure 8:
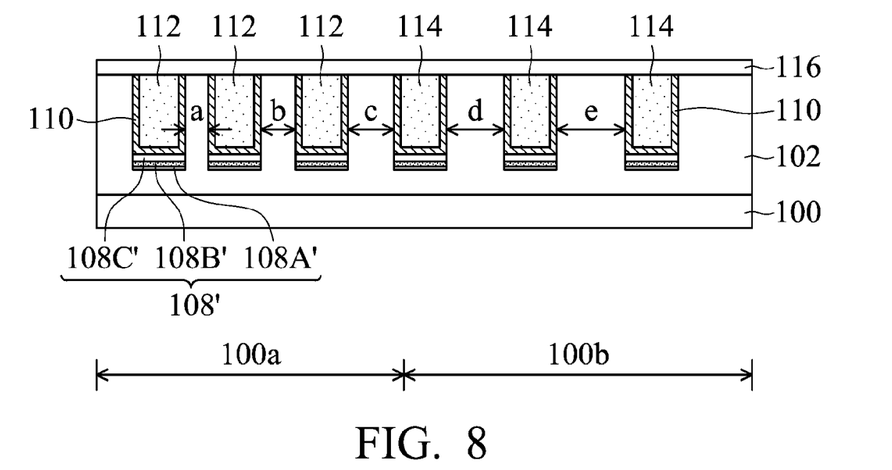

Following the step in FIG. 7, a gate dielectric layer 116 is formed over the epitaxial layer 102, as illustrated in FIG. 8. The gate dielectric layer 116 may include silicon oxide, silicon nitride, silicon oxynitride, high-k dielectrics, other suitable dielectric materials for gate dielectrics, or combinations thereof. High-k dielectrics may include metal oxides, for example, oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof. The gate dielectric layer 116 may be formed by an ordinary process known in the art, such as atomic layer deposition (ALD), chemical vapor deposition (CVD), physical vapor deposition (PVD), thermal oxidation, UV-ozone oxidation, or combinations thereof.

Figure 9:
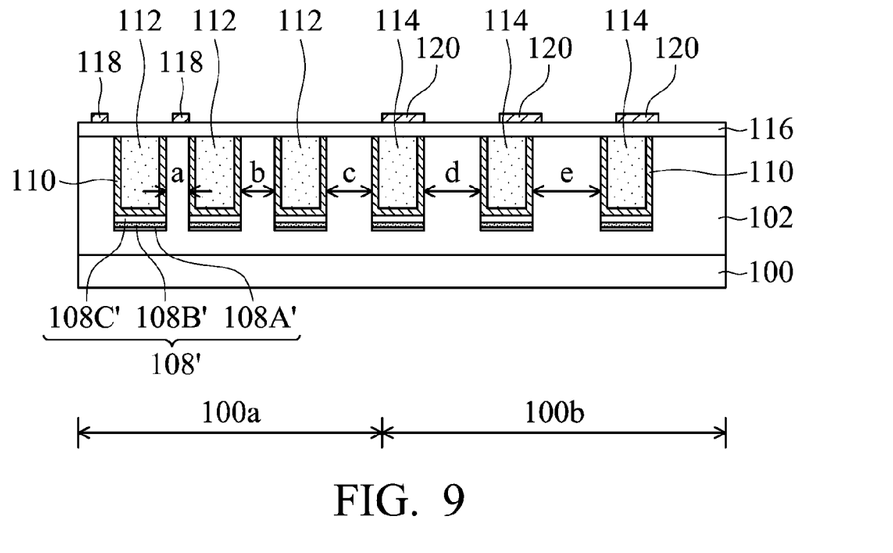

After the formation of the gate dielectric layer 116, two floating gates 118 are formed on the gate dielectric layer over opposite sides of a first column 112 in the active region 100a that is farthest away from the termination region 100b, as shown in FIG. 9. The floating gates 118 may be formed of a material comprising metal, polysilicon, tungsten silicide ($WSi_2$), or combinations thereof. The floating gates 118 may be formed using a process such as low-pressure chemical vapor deposition (LPCVD), plasma enhanced chemical vapor deposition (PECVD), other suitable processes, or combinations thereof. In addition, a plurality of floating gates 120 may also be simultaneously formed over the gate dielectric layer 116 of the termination region 100b, wherein the floating gates 120 covers a portion of the second columns 114 and a portion of the epitaxial layer 102 in the termination region 100b, as shown in FIG. 9. The material and the formation method of the floating gates 120 are similar to the floating gates 118, and hence is not discussed herein to avoid repetition.

Figure 10:
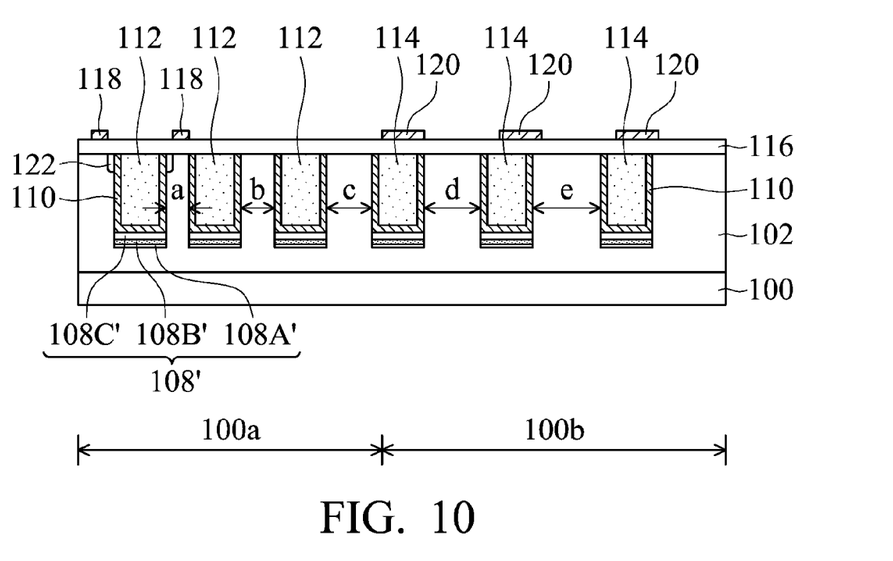

Following the steps in FIG. 9, a source region 122 is formed in the epitaxial layer 102 between the floating gates 118, as shown in FIG. 10. The source region 122 may be formed by a doping process commonly used in the art, such as an ion implantation process.

Figure 11:
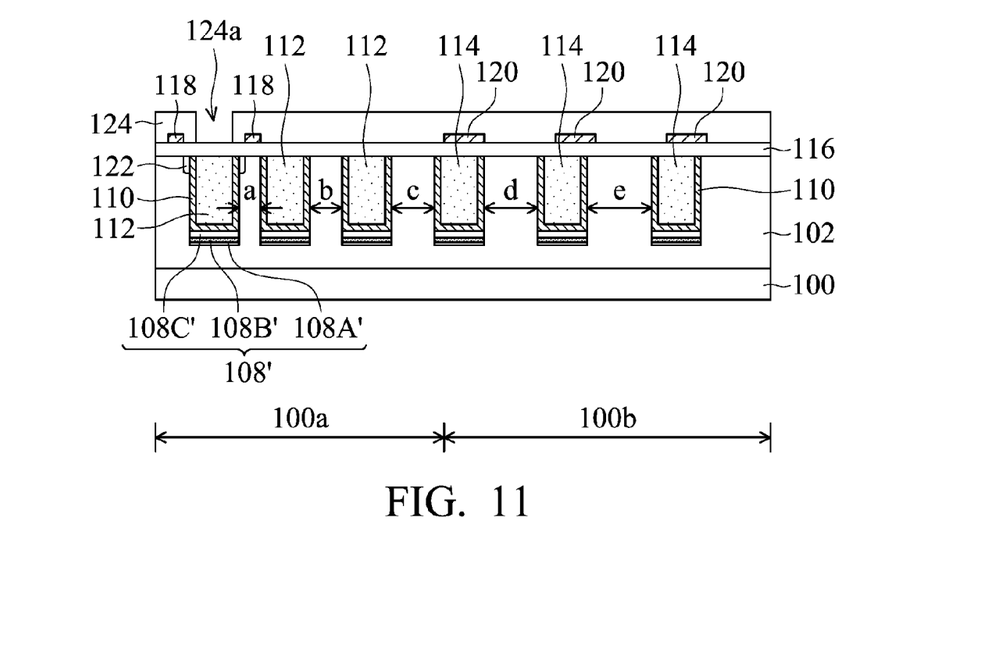

Referring to FIG. 11, an inter-layer dielectric (ILD) layer 124 is formed after the formation of the source region 122. The ILD 124 may be formed covering the gate dielectric layer 116 and the float gates 118 and 120 with a contact hole 124a exposing the source region 122.

Figure 12:
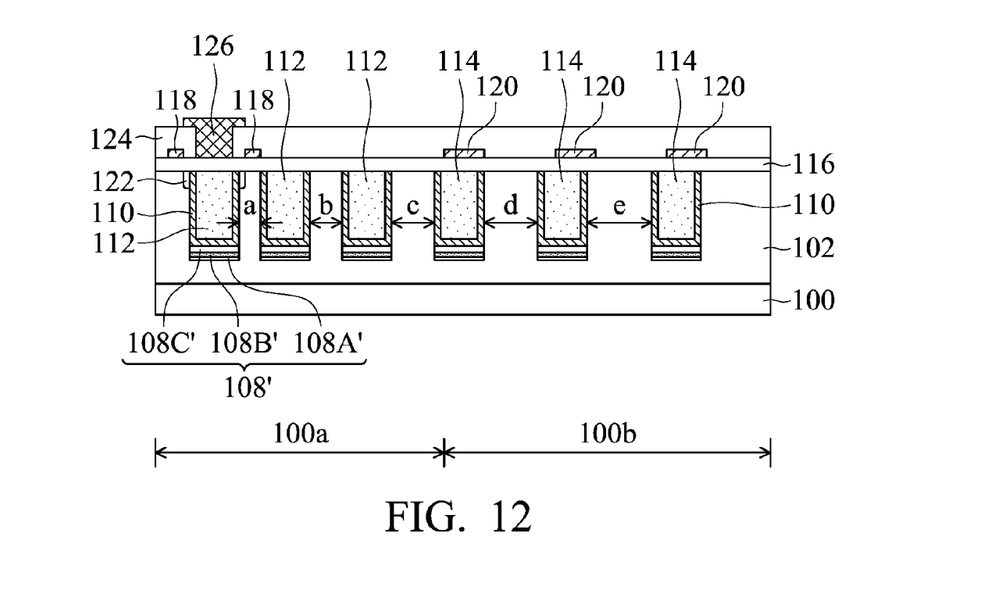
Figure 13:
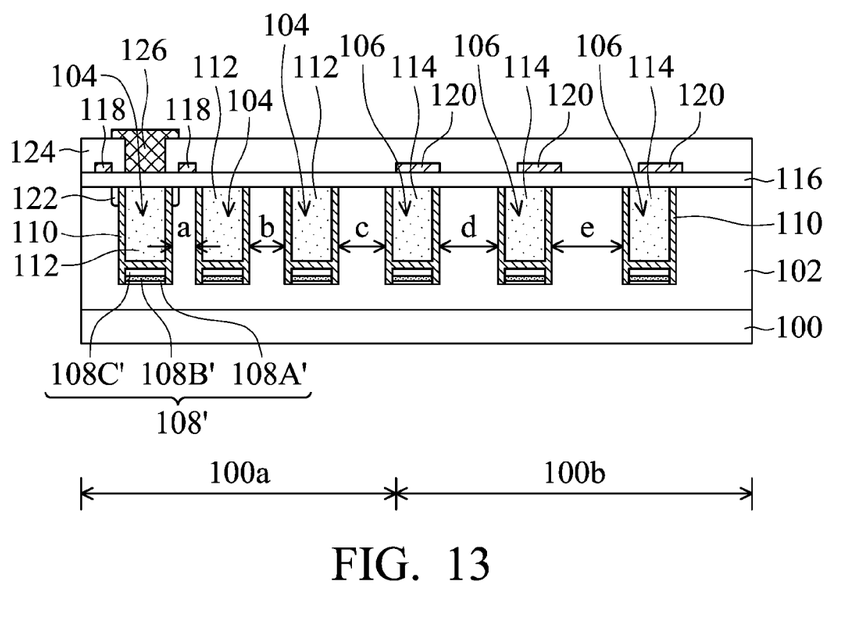

After the step in FIG. 11, a process for forming a contact plug is performed to complete the formation of the super junction device. Referring to FIG. 12, a contact plug 126 extending through the contact hole 124a of the ILD layer 124 is formed on the source region 122, to complete the formation of the super junction device 1000. It should be noted that although the super junction device in FIG. 12 is manufactured from the structure shown in FIG. 4D', the super junction device may also be manufactured from the structure shown in FIG. 4D as shown in FIG. 13. In the embodiments of manufacturing the super junction device from the structure shown in FIG. 4D, the liner 110 is formed on the sidewalls and the bottoms of the trenches 104 and 106 that are not covered by the implant blocker layer 108', as shown in FIG. 13.

The invention utilizes an implant blocker layer 108 or 108' to prevent the termination region of the super junction device from losing potential voltage caused by the diffusion of the implanted dopant in the liner 110 into the bottoms of the second trenches 106, thereby mitigating the generation of the electric field at the bottom of trench in the termination region of the super junction device that normally occurs in a conventional super junction device. Without high electric field at the bottom of trench in the termination region, the breakdown problem in the termination region of a super junction device can be effectively eliminated.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
   a substrate of a first conductivity type having an active region and a termination region;
   an epitaxial layer of the first conductivity type over the substrate;
   a plurality of first trenches in the epitaxial layer of the active region;
   a plurality of second trenches in the epitaxial layer of the termination region, wherein distances between adjacent trenches of the first and the second trenches increase from the active region to the termination region, wherein distances between the adjacent first trenches in the active region increase from the active region to the termination region, and distances between the adjacent second trenches in the termination region increase from the active region to the termination region;
   an implant blocker layer formed at bottoms of the first and second trenches;
   a liner of a second conductivity type different from the first conductivity type conformally formed along sidewalls of the first and second trenches;
   a dielectric material filled in the first and second trenches defining a plurality of first columns and a plurality second column, respectively;
   a gate dielectric layer over the epitaxial layer;
   two floating gates formed on the gate dielectric layer over opposite sides of a first column which is farthest away from the termination region;
   a source region formed between the floating gates;
   an inter-layer dielectric layer covering the gate dielectric layer and the floating gates; and
   a contact plug formed on the source region through the inter-layer dielectric layer.

2. The semiconductor device of claim 1, wherein the implant blocker layer comprises an oxide-nitride-oxide composite layer, a nitride-oxide-nitride composite layer, an oxide-oxynitride-oxide composite layer or a nitride-oxide composite layer.

3. The semiconductor device of claim 1, wherein the implant blocker layer comprises a silicon oxide-silicon nitride-Tetraethyl orthosilicate (TEOS) oxide composite layer, wherein the thickness ratio between silicon oxide, silicon nitride and TEOS oxide is about 1-10:1-10:1-50.

4. The semiconductor device of claim 1, wherein the overall thickness of the implant blocker layer is about 300-5000 A.

5. The semiconductor device of claim 1, further comprising a plurality of floating gates formed over the gate dielectric layer in the termination region, wherein the floating gates covers a portion of the second columns and a portion of the epitaxial layer in the termination region.

6. A method for fabricating the semiconductor device as set forth in claim 1, comprising;
   providing a substrate of a first conductivity type, wherein the substrate has an active region and a termination region;
   forming an epitaxial layer of the first conductivity type over the substrate;
   forming a plurality of first trenches in the epitaxial layer of the active region;
   forming a plurality of second trenches in the epitaxial layer of the termination region, wherein distances between adjacent trenches of the first and the second trenches increase from the active region to the termination region, wherein distances between the adjacent first trenches in the active region increase from the active region to the termination region, and distances between the adjacent second trenches in the termination region increase from the active region to the termination region;

forming an implant blocker layer at bottoms of the first and second trenches;

forming a liner conformally on sidewalls of the first and second trenches;

implanting a dopant of a second conductivity type into the liner, wherein the first and second conductivity types are different, and wherein the implant blocker layer blocks the dopant from entering into the bottoms of the first and second trenches;

filling a dielectric material into the first and second trenches to form a plurality of first columns and a plurality second column, respectively;

forming a gate dielectric layer over the epitaxial layer;

forming two floating gates on the gate dielectric layer over opposite sides of a first column which is farthest away from the termination region;

forming a source region between the floating gates;

forming an inter-layer dielectric layer covering the gate dielectric layer and the floating gates; and forming a contact plug on the source region through the inter-layer dielectric.

7. The method of claim 6, wherein the implant blocker layer comprises an oxide-nitride-oxide composite layer, a nitride-oxide-nitride composite layer or a nitride-oxide composite layer.

8. The method of claim 6, wherein the implant blocker layer comprises a silicon oxide-silicon nitride-Tetraethyl orthosilicate (TEOS) oxide composite layer, wherein the thickness ratio between silicon oxide, silicon nitride and TEOS oxide is about 1-10:1-10:1-50.

9. The method of claim 6, wherein the overall thickness of the implant blocker layer is about 300-5000 Å.

10. The method of claim 6, wherein the implant blocker layer is formed by a high density plasma deposition process.

11. The method of claim 6, further comprising forming a plurality of floating gates over the gate dielectric layer in the termination region, wherein the floating gates cover a portion of the second columns and a portion of the epitaxial layer in the termination region.

12. The semiconductor device of claim 1, wherein the implant blocker layer covers the sidewalls at the bottoms of the first and second trenches.

13. The method of claim 6, wherein the implant blocker layer covers the sidewalls at the bottoms of the first and second trenches.

* * * * *